(12) United States Patent
Hashimoto

(10) Patent No.: US 6,521,483 B1
(45) Date of Patent: Feb. 18, 2003

(54) SEMICONDUCTOR DEVICE, METHOD OF MANUFACTURE THEREOF, CIRCUIT BOARD, AND ELECTRONIC DEVICE

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 09/787,697

(22) PCT Filed: Jul. 21, 2000

(86) PCT No.: PCT/JP00/04866

§ 371 (c)(1),
(2), (4) Date: Mar. 22, 2001

(87) PCT Pub. No.: WO01/10805

PCT Pub. Date: Feb. 15, 2001

(30) Foreign Application Priority Data

Jul. 22, 1999 (JP) ............................................. 11-207905

(51) Int. Cl.7 ........................... H01L 21/44; H01L 23/02
(52) U.S. Cl. ....................... 438/110; 438/109; 257/689; 257/777
(58) Field of Search ................................. 438/109, 110, 438/111, 611; 257/686, 696, 777

(56) References Cited

U.S. PATENT DOCUMENTS

| 4,982,265 A | | 1/1991 | Watanabe | |
|---|---|---|---|---|
| 5,552,963 A | * | 9/1996 | Burns | 257/686 |
| 5,995,379 A | | 11/1999 | Kyougoku | |
| 6,028,352 A | * | 2/2000 | Eide | 257/686 |
| 6,084,293 A | * | 7/2000 | Ohuchi | 257/686 |
| 6,084,294 A | * | 7/2000 | Tomita | 257/686 |
| 6,163,070 A | * | 12/2000 | Mori | 257/686 |

FOREIGN PATENT DOCUMENTS

| JP | 64-71162 A | 3/1989 |
|---|---|---|
| JP | 7-193098 A | 7/1995 |
| JP | 28-70530 | 1/1999 |

* cited by examiner

*Primary Examiner*—Kevin M. Picardat
(74) *Attorney, Agent, or Firm*—Oliff & Berridge, PLC

(57) ABSTRACT

A semiconductor device has first and second substrates (10, 20) disposed so as to be overlaid, and a semiconductor chip (30) mounted on each of the first and second substrates (10, 20). A first interconnect pattern (12) formed on the first substrate (10) has bent portions (16) which project from the surface of the first substrate (10). The bent portions (16) are bonded to a flat portion (26) of a second interconnect pattern (22) formed on the second substrate (20).

22 Claims, 12 Drawing Sheets

SEMICONDUCTOR DEVICE, METHOD OF MANUFACTURE THEREOF, CIRCUIT BOARD, AND ELECTRONIC DEVICE

TECHNICAL FIELD

The present invention relates to a semiconductor device and method of manufacturing the same, a circuit board, and an electronic instrument.

BACKGROUND ART

Conventionally, it is known for a semiconductor device to have a substrate on which an interconnect pattern is formed (an interposer), and to have a semiconductor chip mounted on the interposer. With increasing miniaturization of semiconductor devices and increasing pin counts, the interconnect pattern is required to be even finer, but there are limits to the degree to which the interconnect pattern formed on a single interposer can be made finer. In addition, multi-layer substrates are expensive.

In this case, by using a plurality of interposers, increasing pin counts can be supported. For example, a stack type of semiconductor device has been developed, having a construction in which a plurality of interposers is adhered together, with semiconductor chips mounted on one side or both sides.

As a published example may be cited Japanese Patent Publication No. 2870530, in which by means of bumps, interconnect patterns formed on the upper and lower interposers are electrically connected together. However, with this method, the formation of the bumps involves time and cost, and this is a problem.

The present invention solves the above described problem, and has as its object the provision of a semiconductor device and method of manufacture thereof, a circuit board and an electronic instrument in which the substrates are electrically connected with a simple construction.

DISCLOSURE OF THE INVENTION (1) A semiconductor device of the present invention comprises:

a plurality of substrates which have interconnect patterns and are disposed so as to be overlaid; and a semiconductor chip mounted on at least one of the substrates;

wherein a first interconnect pattern formed on a first substrate which is one of two substrates included in the plurality of overlaid substrates has at least one bent portion which projects from a surface of the first substrate; and wherein the bent portion is electrically connected to at least one flat portion of a second interconnect pattern formed on a second substrate of the two substrates.

The bent portion is formed by a portion of the first interconnect pattern projecting from the surface of the first substrate, and has a simple construction. Since the electrical connection between the two substrates is achieved by means of the bent portion, the formation of bumps is not required.

(2) In this semiconductor device, a through hole may be formed in the first substrate, and the bent portion may enter the through hole and project from a surface of the first substrate opposite to the surface on which the first interconnect pattern is formed.

By means of this, the first interconnect pattern is formed on the surface of the first substrate opposite to that from which the bent portion projects. Therefore, since the first substrate is interposed between the first and second interconnect patterns, short-circuits between the two can be prevented.

(3) In this semiconductor device, a through hole may be formed in the first substrate; and the bent portion may be positioned over the through hole and project from the surface of the first substrate on which the first interconnect pattern is formed.

By means of this, since the bent portion projects from the surface of the first substrate on which the first interconnect pattern is formed, the bent portion can be formed to be higher than the surface of the first substrate.

(4) In this semiconductor device, a plurality of the bent portions may be formed within or over the through hole.

By means of this, it is sufficient to form one through hole corresponding to a plurality of bent portions.

(5) In this semiconductor device, a plurality of the through holes may be formed in the first substrate;

a plurality of the bent portions may be formed in the first interconnect pattern; and each of the bent portions may be formed so as to be positioned over one of the through holes.

By means of this, since the material of the first substrate is present between adjacent bent portions, short-circuits between the bent portions can be prevented.

(6) In this semiconductor device, the second interconnect pattern may be formed on a surface of the second substrate on the side of the first substrate.

By means of this, since the second interconnect pattern is close to the first substrate, even if the bent portions are low, the electrical connection to the flat portion is possible.

(7) In this semiconductor device, the second interconnect pattern may be formed on a surface of the second substrate opposite to the surface of the second substrate which faces to the first substrate; and the bent portion may be electrically connected to the second interconnect pattern through the through hole formed in the second substrate.

By means of this, because the second substrate is interposed between the first and second interconnect patterns, short-circuits between the two are prevented.

(8) In this semiconductor device, the semiconductor chip may be provided between the first and second substrates; and the bent portion may project to the side of the semiconductor chip, and be formed to be higher than the semiconductor chip.

By means of this, without impeding the presence of the semiconductor chip, the electrical conduction between the first and second substrates can be assured. By means of the bent portions, a space greater than the height of the semiconductor chip can be provided between the first and second substrates, and separate provision of a spacer for maintaining the spacing is not required.

(9) In this semiconductor device, the semiconductor chip may be provided on each of the first and second substrates.

This is a stack type of semiconductor device having a plurality of overlaid semiconductor chips.

(10) In this semiconductor device, the semiconductor chip may be provided on one of the first and second substrates.

By means of the first and second interconnect patterns, a multi-layer interconnect can be formed.

(11) In this semiconductor device,
the number of the substrates provided to be overlaid may be three or more;
a central substrate of the three substrates may be the first substrate, and the bent portions may project from both surfaces of the first substrate; and
outer substrates of the three substrates maybe the second substrate.

By means of this, the bent portions of the interconnect pattern formed on the central substrate are electrically connected to the flat portion of the interconnect patterns formed on the outer substrates.

(12) In this semiconductor device,
the number of the substrates provided to be overlaid may be three or more; and
a central substrate of the three substrates may be the second substrate, and outer substrates may be the first substrate.

By means of this, the flat portion of the interconnect pattern formed on the central substrate is electrically connected to the bent portions of the interconnect patterns formed on the outer substrates.

(13) In this semiconductor device,
the number of the substrates provided to be overlaid may be three or more;
one of two outer substrates of the overlaid substrates may be the first substrate, and the other may be the second substrate; and
at least one center substrate of the overlaid substrates may have the bent portion and the flat portion, and may be the first substrate with respect to one of the two outer substrates, and may be the second substrate with respect to the other of the two outer substrates.

By means of this, the center substrate is constituted to function as both the first and second substrates.

(14) A circuit board of the present invention has the above described semiconductor device mounted.

(15) An electronic instrument of the present invention has the above described semiconductor device.

(16) A method of manufacture of a semiconductor device of the present invention comprises the steps of:
mounting a semiconductor chip on at least one of a plurality of substrates having interconnect patterns;
providing the substrates so as to be overlaid; and
electrically connecting two substrates of the overlaid substrates;
wherein a first interconnect pattern formed on a first substrate of the two substrates has a bent portion which projects from a surface of the first substrate; and
wherein the bent portion is electrically connected to a flat portion of a second interconnect pattern formed on a second substrate of the two substrates.

According to the present invention, the bent portion is formed by a portion of the first interconnect pattern projecting from the surface of the first substrate, and have a simple construction. Since the electrical connection between the two substrates is achieved by means of the bent portion, the formation of bumps is not required.

(17) In this method of manufacture of a semiconductor device, the plurality of substrates may be positioned with the outer form of the substrates as a reference.

(18) In this method of manufacture of a semiconductor device, the plurality of substrates maybe positioned with holes formed in the substrates as a reference.

(19) In this method of manufacture of a semiconductor device, at least one of pressure and heat may be applied to the bent portion to electrically connect the bent portion to the flat portion.

(20) In this method of manufacture of a semiconductor device,
the bent portion may be formed on each of the interconnect patterns formed on the substrates; and
the bent portion formed on each of the substrates may be electrically connected to the flat portion in a single operation.

By means of this, the electrical connection of the plurality of bent portions and the plurality of flat portions can be carried out in a single operation, and the process can be made shorter.

BEST MODE FOR CARRYING OUT THE INVENTION

The present invention is now described in terms of preferred embodiments, with reference to the drawings.

First Embodiment

Figure 1:
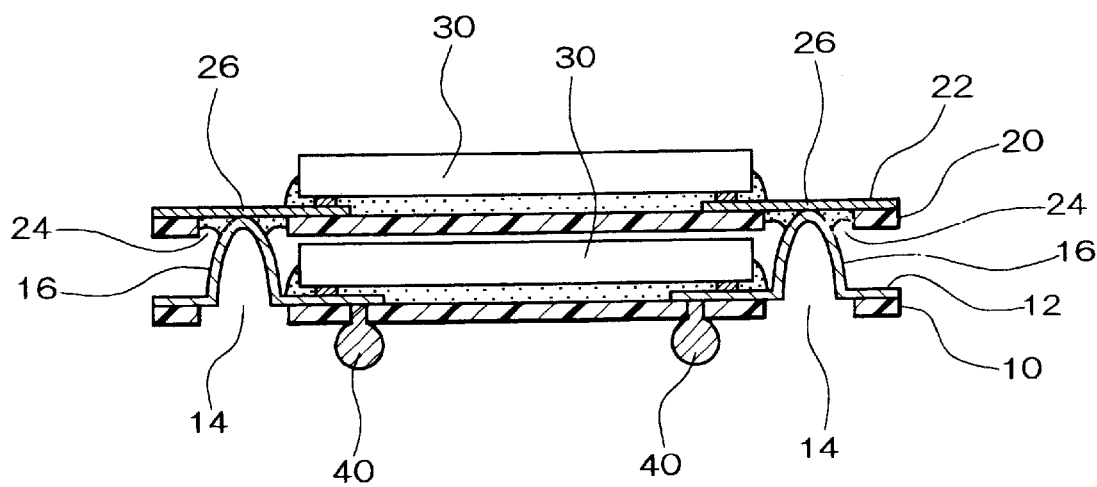
FIG. 1 shows a first embodiment of the semiconductor device to which the present invention is applied.

FIG. 1 shows a first embodiment of the semiconductor device to which the present invention is applied. The semiconductor device comprises first and second substrates 10 and 20. It should be noted that in a semiconductor device having three or more substrates, any particular two of these substrates are the first and second substrates 10 and 20. The first and second substrates 10 and 20 may be two immediately adjacent substrates.

On each of the first and second substrates 10 and 20 an interconnect pattern (in this embodiment, first and second interconnect patterns 12 and 22) are formed. With the first and second interconnect patterns 12 and 22 formed, the first and second substrates 10 and 20 can be referred to as interconnect substrates.

The material of the first and second substrates 10 and 20 may be either an organic material or an inorganic material. As organic materials may be used polyimide, polyester, polysulfone resins, or the like, and as an inorganic material may be used silicon, glass, ceramic, metal, or the like, and a combination of organic and inorganic materials may also be used.

As examples of the first and second substrates 10 and 20 may cited a flexible substrate formed of a polyimide resin (such as for example a TAB tape (Tape Automated Bonding Tape), a ceramic substrate, a glass substrate, and a glass epoxy substrate.

Figure 2:
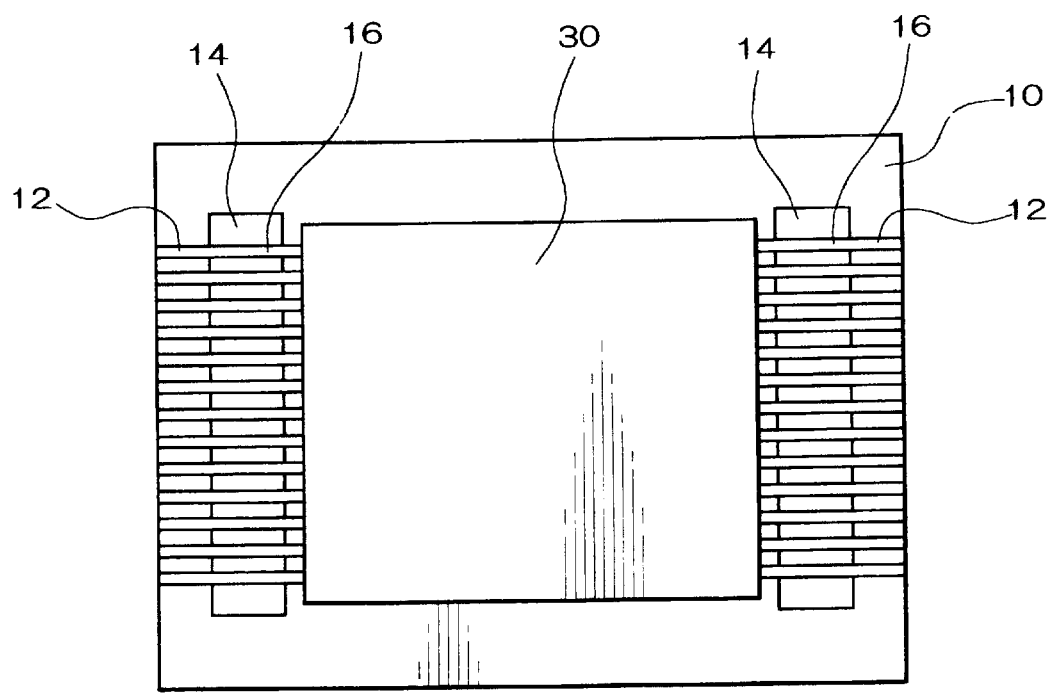
FIG. 2 shows a first substrate of the first embodiment of the semiconductor device to which the present invention is applied.

In this embodiment, in the first and second substrates 10 and 20 is formed at least one (one, or a plurality of) through holes (or vias or opening) 14 and 24. FIG. 2 is a plan view of the first substrate 10. The through holes 14 are formed to avoid the mounting region of a semiconductor chip 30. A through hole 14 maybe, as shown in FIG. 2, a slot coinciding with a plurality of bent portions 16, or may be of a size such as to coincide with only one bent portion 16.

The through holes 24 formed in the second substrate 20 are also formed to avoid the mounting region of the semiconductor chip 30. One through hole 24 maybe slot into which enter the ends of a plurality of bent portions 16, or may be of a size such that the end of only one bent portion 16 enters.

The first and second interconnect patterns 12 and 22 may be formed on single sides of the first and second substrates 10 and 20, or may be formed on both sides. The first and second interconnect patterns 12 and 22 may have formed lands for connection to electrodes (pads) of the semiconductor chip 30 or external terminals 40. Except for the electrically connected portions (for example, lands, bent portions 16, flat portion 26), the first and second interconnect patterns 12 and 22 are preferably covered with a protective layer of solder resist or the like.

The first and second interconnect patterns 12 and 22 may be adhered by an adhesive (not shown in the drawings) to the first and second substrates 10 and 20, constituting a three-layer substrate. In this case, the first and second interconnect patterns 12 and 22 are commonly formed by etching a metal foil of copper foil or the like or a conducting foil. The metal foil of copper foil or the like or conducting foil is first adhered to the first and second substrates 10 and 20 by an adhesive (not shown in the drawings).

The first and second interconnect patterns 12 and 22 may be constructed of multiple layers. For example, after laminating a film of any of copper, chromium, titanium, nickel, or titanium-tungsten, this may be etched to form first and second interconnect patterns 12 and 22. For the etching, photolithography may be applied.

Alternatively, the first and second interconnect patterns 12 and 22 may be formed on the first or second substrate 10 without an adhesive, to constitute a two-layer substrate. In a two-layer substrate, a thin film is formed by sputtering or the like, and plating is carried out, to form the first and second interconnect patterns 12 and 22. The first and second interconnect patterns 12 and 22 may also be formed by the additive method. Even if a two-layer substrate, the first and second interconnect patterns 12 and 22 have a thickness sufficient to allow plastic processing.

As the first and second substrates 10 and 20 (interconnect substrates) on which the first and second interconnect patterns 12 and 22 are formed may equally be employed a built-up interconnect board constructed from an insulating resin and interconnect pattern which are laminated, or a multi-layer substrate in which a plurality of substrates are laminated, or a double-sided substrate or the like.

On the interconnect pattern 12 is formed at least one (one or a plurality of) bent portions 16. Linear portions (interconnects) of the interconnect pattern 12 are bent, forming the bent portions 16. The bent portions 16 project from the surface of the first substrate 10. The ends of the bent portions 16 are, as shown in FIG. 1, bent in a rounded form. The bent portions 16 are formed by plastic deformation of a part of the first interconnect pattern 12. If the first interconnect pattern 12 is flexible, the bent portions 16 will also be flexible.

Figure 3:
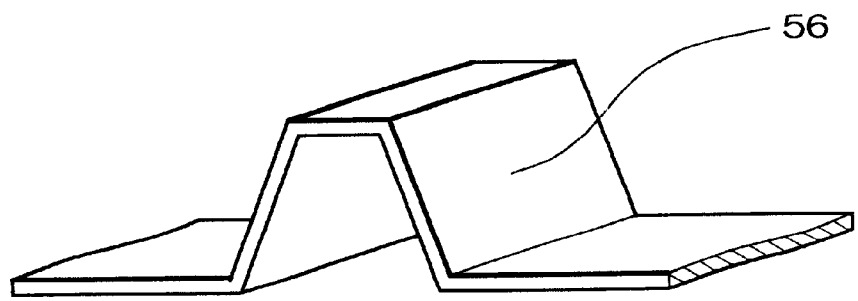
FIG. 3 shows a modification of the first embodiment.

As a modification, bent portions 56 shown in FIG. 3 have substantially level apices. With the bent portions 56, by means of the level apices, the area of contact with another interconnect pattern (in practice the second interconnect pattern 22) is increased, and a more positive electrical conduction can be ensured. The description of this embodiment can also be applied to this modification.

On the projected surface of the bent portions 16 shown in FIG. 1, that is, the surface contacting the second interconnect pattern 22, plating is preferably carried out to better ensure positive electrical conduction. For example, tin or solder plating may be applied, an oxidation resistant gold plating may be applied.

The bent portions 16 are formed to coincide with the through holes 14. A plurality of bent portions 16 is formed so as to coincide with a single through hole 14. In this embodiment, the bent portions 16 do not enter the through holes 14. In more detail, the bent portions 16 are formed over the through holes 14 to project from the surface of the first substrate 10 on which the first interconnect pattern 12 is formed.

Figure 4:
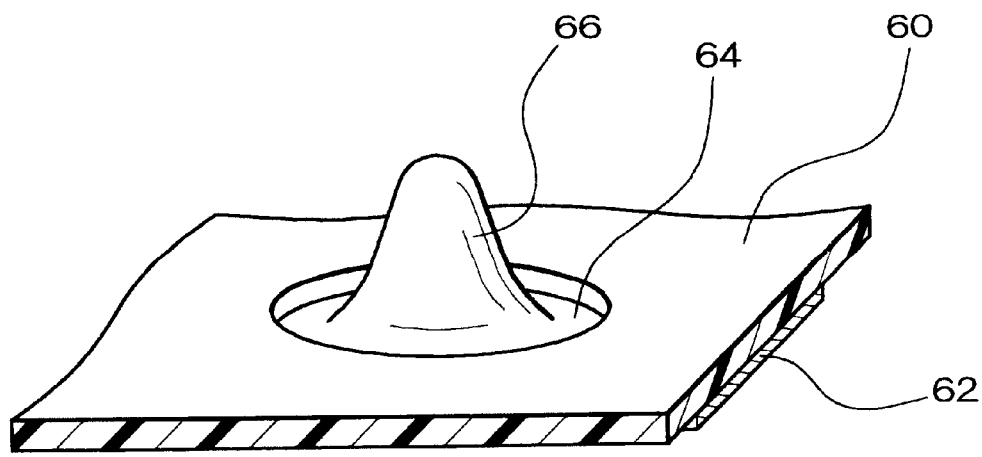
FIG. 4 shows a modification of the first embodiment.

As a modification, bent portions 66 shown in FIG. 4 enter through holes 64 formed in a first substrate 60. In more detail, the bent portions 66 project from the surface of the first substrate 60 opposite to the surface on which a first interconnect pattern 62 is formed. The formation is such that one bent portion 66 and one through hole 64 coincide. The bent portions 66 have a domed form. The bent portions 66 are formed by plastic deformation of the portions blocking the through holes 64 in the first interconnect pattern 62 (the portions larger than the through holes 64). In the process of formation, provided it is within the limits of not interfering with electrical conduction, breaks (cracks) of the bent portions 66 may occur. The description of this embodiment can also be applied to this modification.

It should be noted that if an adhesive is interposed between the first substrate 60 and the first interconnect pattern 62, when the bent portions 66 are formed, adhesive may be present between the through holes 64 and the bent portions 66. By virtue of this, thermal stress applied to the bent portions 66 can be absorbed by the adhesive.

As shown in FIG. 1, when the semiconductor chip 30 is disposed on the side from which the bent portions 16 project, the bent portions 16 are formed to be higher than the semiconductor chip. In more detail, the bent portions 16 have their extremities formed to extend past the surface of the semiconductor chip 30 opposite the first substrate 10, and contact the second interconnect pattern 22.

The second interconnect pattern 22 has at least one (one or a plurality of) flat portion 26. In other words, other than in the flat portion 26, the second interconnect pattern 22 may have bent portions (with the same nature as the bent portions 16) formed. The flat portion 26 is formed to coincide with the through holes 24. As a result, with the through holes 24 interposed, electrical connection with the flat portion 26 is possible.

Here the flat portion 26 may have a level surface such as to contact the end surface of the bent portions 16, but not to contact the side surface. Therefore, the flat portion 26 may be bent in the direction facing the bent portions 16. Alternatively, the flat portion 26 may be a bump (projection) formed on the second interconnect pattern 22 by plating or half-etching or the like. If the flat portion 26 projects in the direction of the bent portions 16, the amount of bending of the bent portions 16 is reduced, and the generation of cracks at the time of formation can be prevented. In this case, the portion of electrical connection of the first and second interconnect patterns 12 and 22 includes the bumps (flat portion 26), but also includes the bent portions 16. Therefore, even in this example, there is a distinction from the prior art in which the electrical connection is by means of the bumps only.

The first and second substrates 10 and 20 are disposed so as to be overlaid. It is sufficient for the first and second substrates 10 and 20 to overlap at least partially. If first and second substrates 10 and 20 are of the same size and shape, they may overlap completely.

In this embodiment, the second interconnect pattern 22 is positioned on the opposite side of the second substrate 20 from the first substrate 10. Through the through holes 24, the bent portions 16 formed on the first interconnect pattern 12 are electrically connected to the flat portion 26 of the second interconnect pattern 22.

For the electrical connection, it is sufficient for the metal (for example, formed by plating) formed on the surfaces of the bent portions 16 and flat portion 26 to be bonded. More specifically, metal bonds may be gold-gold, gold-tin, solder, or the like. For the metal bond, single-point bonding may be applied, and ultrasound, heat or pressure may be applied to diffuse the materials. Furthermore, a mechanical pressure welding by means of crimping or the like may be applied.

By means of brazing such as soldering, or using a conducting paste (resin including silver paste or the like) or conducting adhesive, or the like, the bent portions 16 and the flat portion 26 may be electrically connected.

For the electrical connection between the bent portions 16 and the flat portion 26, an anisotropic conducting adhesive material may be used. The anisotropic conducting adhesive material is an adhesive material which conducts only in the direction in which pressure is applied, and has as the adhesive a resin in which are dispersed particles of a metal such as aluminum or particles of resin to which a metal coating has been applied. This may be an anisotropic conducting film (ACF) which is formed in a sheet form and is used by adhering to the points of adhesion, or an anisotropic conducting adhesive (ACP) which is formed in paste form, and is used by being spread on the points of adhesion.

Alternatively, an adhesive in which conducting particles are not mixed may be used. For example, using the contraction force of an insulating resin, the bent portions 16 and flat portion 26 may be bonded. In this case, an adhesive in which conducting particles are not mixed will be less expensive, and therefore the semiconductor device manufacture can be achieved at lower cost.

The material used for the electrical connection between the bent portions 16 and the flat portion 26 may be the same as that used for the electrical connection between the semiconductor chip and the interconnect pattern.

According to this embodiment, the first and second interconnect patterns 12 and 22 can be electrically connected. If the bent portions 16 are easily flexed, the bent portions 16 absorb stress, and the occurrence of breaks in the electrical connection portion can be reduced.

In this embodiment, a semiconductor chip 30 is mounted on each of the first and second substrates 10 and 20. On the first substrate 10, the first interconnect pattern 12 is formed on the side of the second substrate 20, and on this surface the semiconductor chip 30 is mounted. That is to say, the semiconductor chip 30 is disposed between the first and second substrates 10 and 20. On the second substrate 20, the second interconnect pattern 22 is formed on the surface opposite to the first substrate 10, and on this surface the semiconductor chip 30 is mounted.

Alternatively, the semiconductor chip 30 may be mounted on the surfaces of the first and second substrates 10 and 20 opposite to those on which the first and second interconnect patterns 12 and 22 are formed. In this case, through the electrical connection portion (through holes or via holes or the like) between both sides of the first and second substrates 10 and 20, the electrical connection between the semiconductor chip 30 and the first and second interconnect patterns 12 and 22 is achieved.

It should be noted that the semiconductor device of the present invention has a plurality of substrates, and a semiconductor chip mounted on one of the substrates. Therefore, a semiconductor chip may be mounted on one only of the first and second substrates, or a semiconductor chip may be mounted on a substrate other than the first and second substrates.

In this embodiment, face-down mounting is applied as the mounting method. In the face-down mounting method, for the electrical connection between the bumps on the semiconductor chip 30 and the interconnect patterns (for example, the first and second interconnect patterns 12 and 22), the above described method of electrical connection of the bent portions 16 and the flat portion 26 can be applied.

Between the semiconductor chip 30 and the substrate (for example, the first and second substrates 10 and 20) a resin (underfill) may be provided. When an anisotropic conducting material is used, the anisotropic conducting material may also serve as a sealing resin.

In addition to face-down mounting, a face-up type of mounting using wire bonding, or the TAB mounting method using fingers (inner leads) may be applied. On a single substrate (for example, the first and second substrates 10 and 20), a plurality of semiconductor chips 30 may be mounted.

The semiconductor chips 30 mounted on the first and second substrates 10 and 20 may be the same. Since the bent portions 16 and the flat portion 26 are electrically connected, electrodes (pads) in the same positions on the two semiconductor chips 30 and one external terminal can be electrically connected. Then if the semiconductor chip 30 is a memory device, from one external terminal information in each memory device in the memory cell at the same address can be read out or written in. It should be noted that if each of the two semiconductor chips 30 has a respective chip select terminal, then by electrical connection to different external terminals, chip selection can be achieved. Electrodes (pads) in the same positions on the two semiconductor chips 30 may be electrically connected to different external terminals 40. In this case, the first interconnect pattern 12 is formed so that the bent portions 16 are not electrically connected to the semiconductor chip 30 mounted on the first substrate 10. By inputting signals to different external terminals 40, chip selection is achieved.

This embodiment of the semiconductor device has a plurality of external terminals 40. The external terminals 40 are provided on at least either of (and possibly both) substrates positioned on the outside of a plurality of substrates, such as for example the first and second substrates 10 and 20.

In this embodiment, the external terminals 40 are provided on the first substrate 10. The external terminals 40 are electrically connected to the first interconnect pattern 12. In more detail, through holes are formed in the first substrate 10, and with the through holes interposed the external terminals 40 are provided on the first interconnect pattern 12. The external terminals 40 are formed of solder or the like. The through holes may be filled with solder, which is fused and formed into balls by surface tension, or the solder balls may be mounted on a conducting material provided in the through holes. The inner surface of the through holes may be plated and the through holes formed. As a modification, the two sides of the first substrate 10 may be electrically connected by through holes or the like, and on the surface of the first substrate 10 opposite to the first interconnect pattern 12, interconnects may be formed, and the external terminals provided on these interconnects.

Alternatively, when the semiconductor device is mounted on a motherboard, solder cream spread on the motherboard may be used, and the external terminals may be formed on the first interconnect pattern 12 (for example, on lands thereof) by the surface tension when this is fused. This semiconductor device is a so-called land grid array type of semiconductor device.

Alternatively, a part of the first substrate 10 may be extended beyond the second substrate 20, and the external terminals may be formed on this extended portion. In this case, a part of the first interconnect pattern 12 may be the external terminals. Alternatively, connectors to be the external terminals may be mounted on the first substrate 10.

According to this embodiment, the bent portions 16 are formed by a part of the first interconnect pattern 12 projecting from the surface of the first substrate 10, and can have a simple construction. By means of the bent portions 16, electrical connection between the first and second substrates 10 and 20 can be achieved, as a result of which it is not necessary to form bumps.

This embodiment of the semiconductor device has the construction as described above, and its method of manufacture is now described.

In this embodiment, a plurality of substrates (for example, the first and second substrates 10 and 20 on which the first and second interconnect patterns 12 and 22 are formed) are taken. On at least one substrate (for example, the first and second substrates 10 and 20), the semiconductor chip 30 is mounted. The first and second substrates 10 and 20 are disposed so as to overlap, and the adjacent first and second substrates 10 and 20 are electrically connected. It should be noted that the process of mounting the semiconductor chip 30 maybe carried out before the process of electrically connecting the first and second substrates 10 and 20, or may be carried out thereafter, or may be carried out simultaneously therewith.

The electrical connection of the first and second substrates 10 and 20 is, that is to say, the electrical connection of the first and second interconnect patterns 12 and 22 formed respectively thereon. The bent portions 16 formed on the first interconnect pattern 12 are electrically connected to the flat portions 26 on the second interconnect pattern 22.

Figure 5:
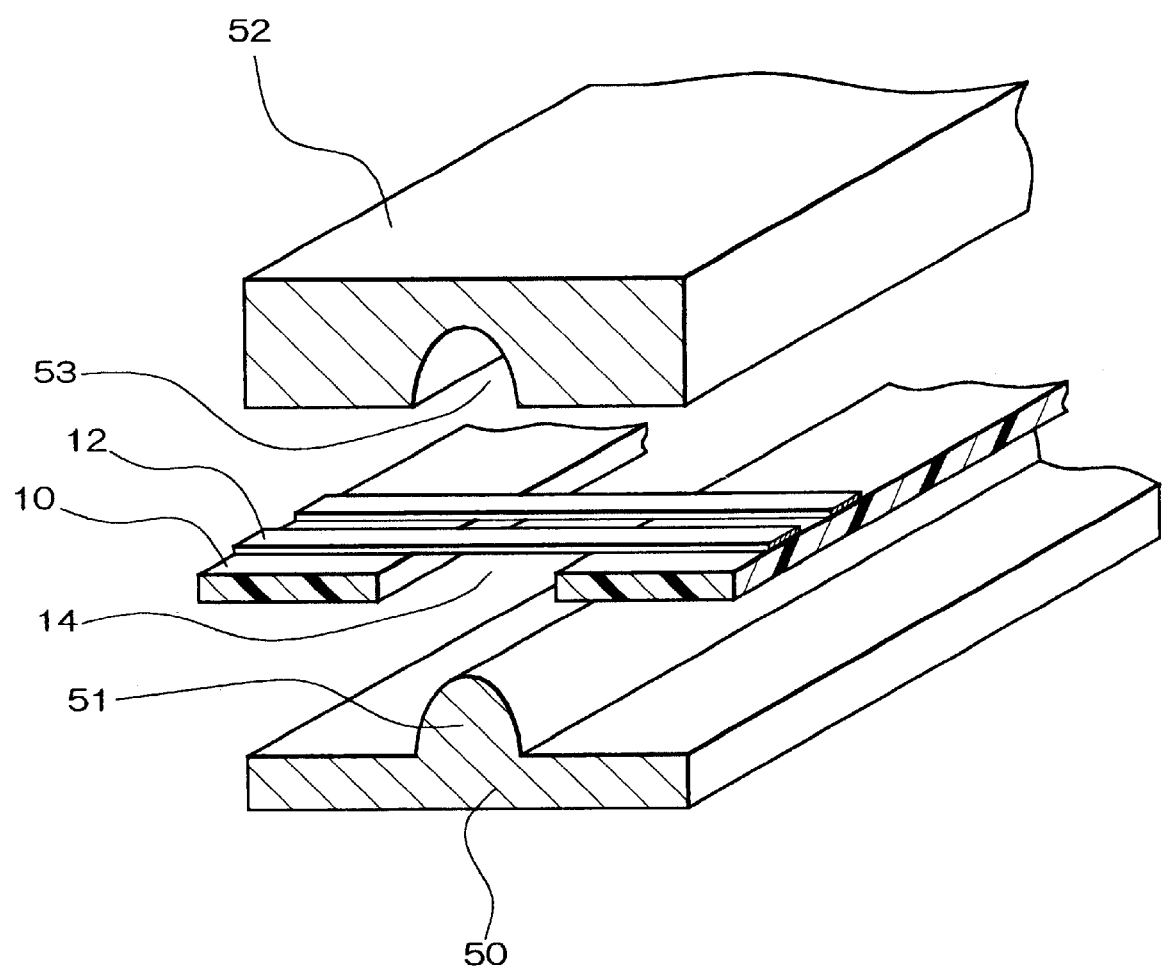
FIG. 5 shows the method of manufacture of the first embodiment of the semiconductor device to which the present invention is applied.

The method of forming the bent portions 16 is now described with reference to FIG. 5. The bent portions 16 are formed by plastic deformation of the first interconnect pattern 12. For example, the first substrate 10 is positioned between a mold (for example, a metal die) 50 having a projection 51 of a form which is the inverse of the depressed surface of the bent portions 16 and a mold (for example, a metal die) 52 having a depression 53 of a form which is the inverse of the projected surface of the bent portions 16. It should be noted that the projection 51 is formed of a size to pass through the through holes 14. Next, by means of the molds 50 and 52, the first interconnect pattern 12 is subjected to press forming, and the bent portions 16 are formed.

The bent portions 16 may be formed at the stage of forming the first substrate 10 (at a stage before the mounting process), or may be formed at the same time that the first and second interconnect patterns 12 and 22 are connected. In this case, while forming the bent portions 16, the bent portions 16 and the flat portion 26 are finally bonded.

Figure 6:
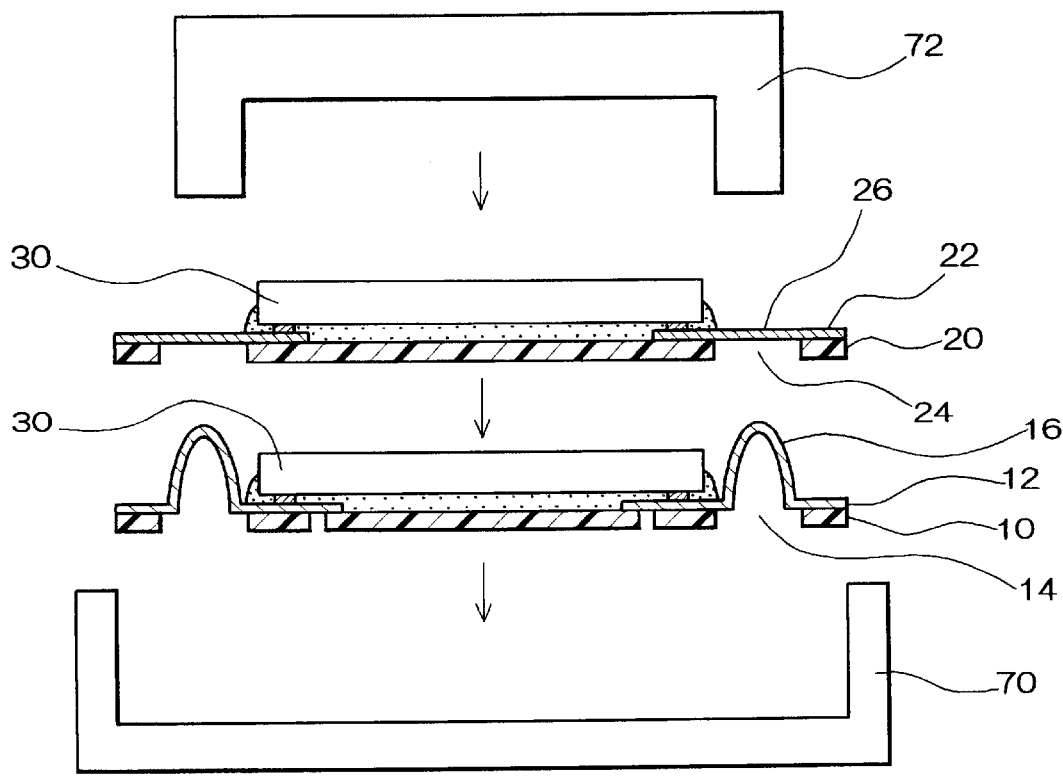
FIG. 6 shows the method of manufacture of the first embodiment of the semiconductor device to which the present invention is applied.

FIG. 6 illustrates a process of disposing a plurality of substrates so as to be overlaid. In this embodiment, since a plurality of substrates is disposed to be overlaid, substrate positioning is required. Here, the plurality of substrates (for example, the first and second substrates 10 and 20) may be positioned by reference to the outer form.

For example, as shown in FIG. 6, container 70 is used in which a depression is formed. The depression formed in the container 70 corresponds to the outer form of the first and second substrates 10 and 20. In more detail, when the first and second substrates 10 and 20 are formed with the same outer form, and are disposed so as to be entirely overlaid, the inner side surface of the depression forms a vertical surface. Therefore, when the first and second substrates 10 and 20 are inserted within the depression, they are mutually positioned with reference to their outer form. Then if the bent portions 16 and flat portion 26 are also formed to be accurately positioned with respect to the outer form of the first and second substrates 10 and 20, they will be accurately positioned. It should be noted that a part of the outer form of the first and second substrates 10 and 20 maybe used as a reference for positioning. For example, the positioning may be carried out with reference to the four corners of the first and second substrates 10 and 20.

Figure 7:
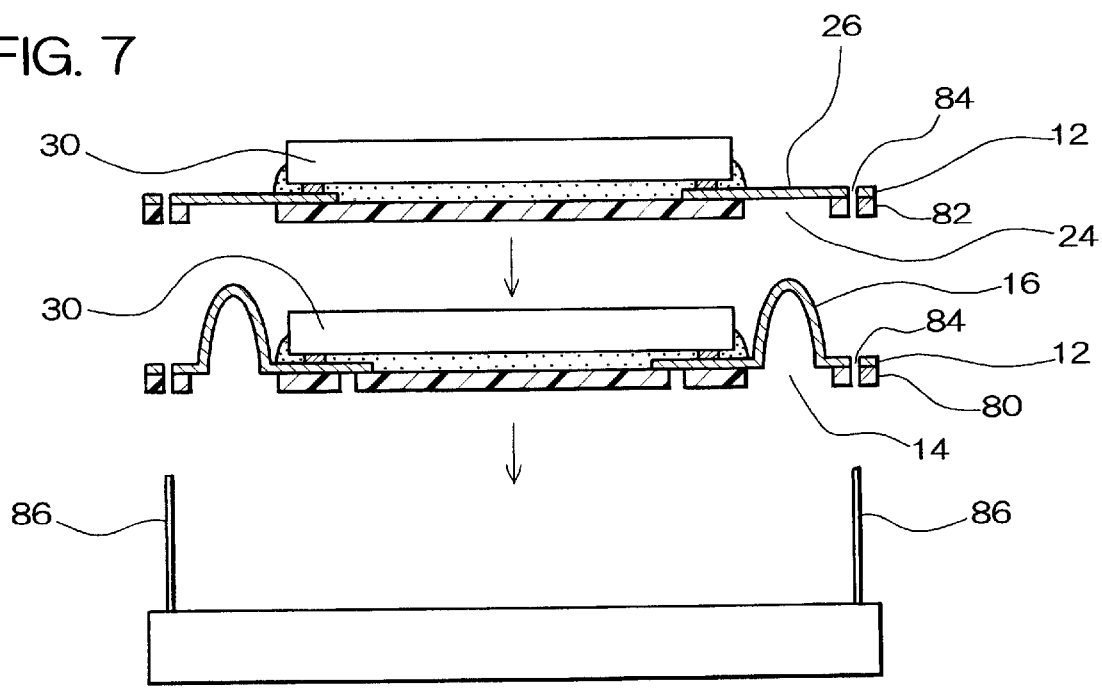
FIG. 7 shows the method of manufacture of the semiconductor device to which the modification of the first embodiment applies.

As a modification, as shown in FIG. 7, through holes 84 may be formed in first and second substrates 80 and 90, and the positioning carried out with the through holes 84 as reference. For example, through pins 86 may be inserted in holes 84.

As shown in FIG. 6, for the bonding of the bent portions 16 and the flat portion 26, a tool 72 may be used. For example, at least one of pressure and heat is applied to the bent portions 16 by the tool 72. The plurality of bent portions 16 and the plurality of flat portions 26 maybe simultaneously bonded. When the interconnect pattern formed on at least two substrates of three or more overlaid substrates has bent portions, then bonding of the flat portions of these may be carried out simultaneously. In this way, the bent portions 16 and the flat portions 26 are bonded.

To bond the bent portions 16 and the flat portions 26, the above described material (for example, an adhesive or the like) may be provided in advance on at least one of the bent portions 16 and flat portions 26. When a thermosetting adhesive is used, by the application of heat the adhesive power of the adhesive is activated. If the step of providing the adhesive or the like in the bonding of the semiconductor chip 30, and the step of providing the adhesive or the like for bonding the bent portions 16 and the flat portions 26 are carried out simultaneously, the process can be simplified.

The bond between the bent portions 16 and the flat portions 26 may be any of (1) bonding with a brazing material including solder, (2) solid diffusion bonding (metal bond) using the application of ultrasonic vibration and heat to clean surfaces, (3) bonding by mechanical crimping, and (4) adhesive conducting bonding by means of a conducting paste or the like. Whichever method is used, the bent portions 16 and the flat portions 26 may be bonded one at a time, or may be bonded more than one at a time, or may all be bonded simultaneously. If the same method is used for the electrical connection of the semiconductor chip 30 and the interconnect pattern, these preparatory steps are simplified.

According to this embodiment, the bent portions 16 are formed by bending a part of the first interconnect pattern 16, and therefore can be formed simply. Since the electrical connection between the first and second substrates 10 and 20 is achieved by the bent portions 16, it is not necessary to form bumps.

Second Embodiment

Figure 8:
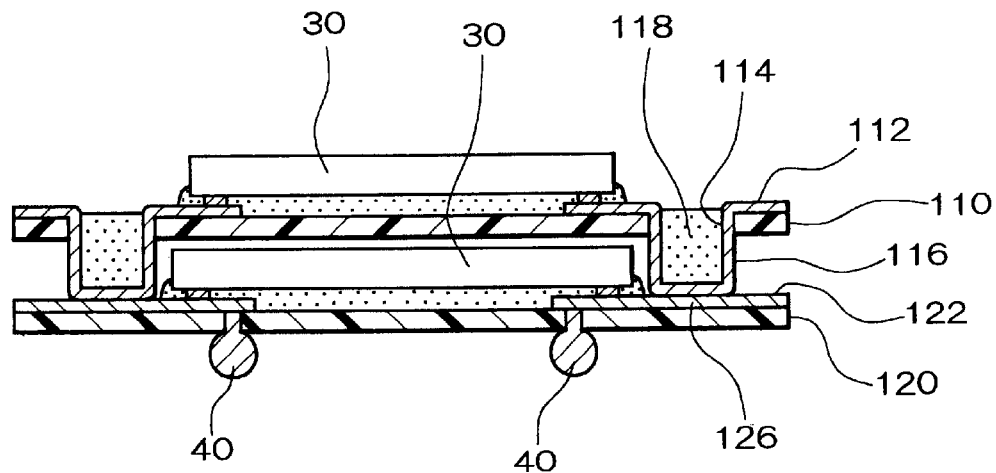
FIG. 8 shows a second embodiment of the semiconductor device to which the present invention is applied.

FIG. 8 shows a second embodiment of the semiconductor device to which the present invention is applied.

In this embodiment, the bent portions 116 project from the opposite side of a first substrate 110 from that of the surface on which a first interconnect pattern 112 is formed. The bent portions 116 extend into through holes 114 formed in the first substrate 110.

The depression of the bent portions 116 may be filled with a resin 118. By means of the resin 118, the bent portions 116 are reinforced, excessive bending and deformation of the bent portions 116 by applied stress is prevented, and the stress applied to the bent portions 116 can be absorbed. By means of the resin 118, even if a split occurs in the bent portions 116, the destruction of the bent portions 116 can be prevented. Preferably the entire depression of the bent portions 116 is filled with the resin 118.

The resin 118 deforms sufficiently to absorb stress, but preferably has characteristics such as to maintain a fixed form. The resin 118 is preferably rich in softness, and rich in heat resistance. If a resin rich in softness is used, this is advantageous in the absorption of externally applied stress and thermal stress or the like by the resin.

As the resin 118 may be used, for example, a polyimide resin or the like, and of these, one with a low Young's modulus (for example, an olefin polyimide resin, or as an example of other than a polyimide resin BCB made by Dow Chemical, or the like) is preferably used. In particular, it is preferable that the Young's modulus be at most approximately 300 kg/mm$^2$. As the resin 118, for example, a silicone denatured polyimide resin, epoxy resin, silicone denatured epoxy resin, or the like may be used.

In this embodiment also, first and second substrates 110 and 120 are disposed so as to be overlaid. The first interconnect pattern 112 is positioned on the surface of the first substrate 110 opposite to that of the second substrate 120. A second interconnect pattern 122 is positioned on the surface of the second substrate 120 on the side of the first substrate 110. The bent portions 116 projecting through the through holes 114 formed in the first substrate 110 are electrically connected to flat portions 126.

In this embodiment, a semiconductor chip 30 is mounted on each of the first and second substrates 110 and 120. On the first substrate 110, on the opposite surface from the second substrate 120 is formed the first interconnect pattern 112, and on this surface the semiconductor chip 30 is mounted. On the second substrate 120, the second interconnect pattern 122 is formed on the side of the first substrate 110, and on this surface the semiconductor chip 30 is mounted. That is to say, the semiconductor chip 30 is disposed between the first and second substrates 110 and 120.

The external terminals 40 are provided on the second substrate 120. In more detail, the same details of the external terminals 40 described in the first embodiment can be applied to this embodiment.

In this embodiment, the description of the above first embodiment and its modifications can be applied. In this embodiment also, the effect described in the first embodiment can be achieved.

Third Embodiment

Figure 9:
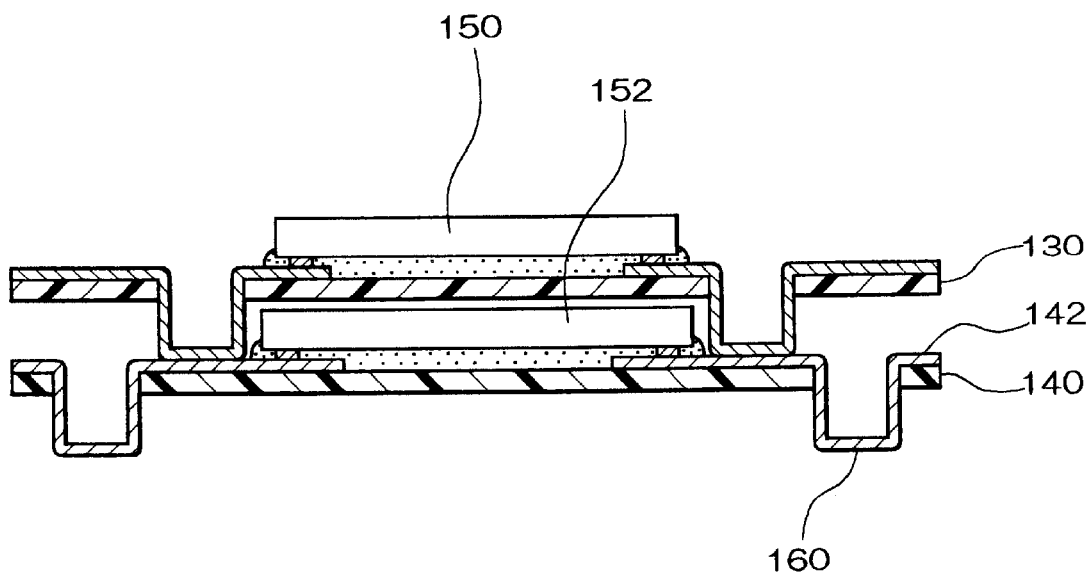
FIG. 9 shows a third embodiment of the semiconductor device to which the present invention is applied.

FIG. 9 shows a third embodiment of the semiconductor device to which the present invention is applied. This embodiment differs from the second embodiment in the following points.

On first and second substrates 130 and 140 are mounted semiconductor chips 150 and 152 of different sizes. External terminals 160 are formed by bending an interconnect pattern. For example, a second interconnect pattern 142 is bent to form external terminals 160. To the external terminals 160, the description of the bent portions 16 described in the first embodiment can be applied.

In other respects, in this embodiment, the description described in the first embodiment and its modifications and the second embodiment can be applied. In this embodiment also, the effect described in the first embodiment can be achieved.

Fourth Embodiment

Figure 10:
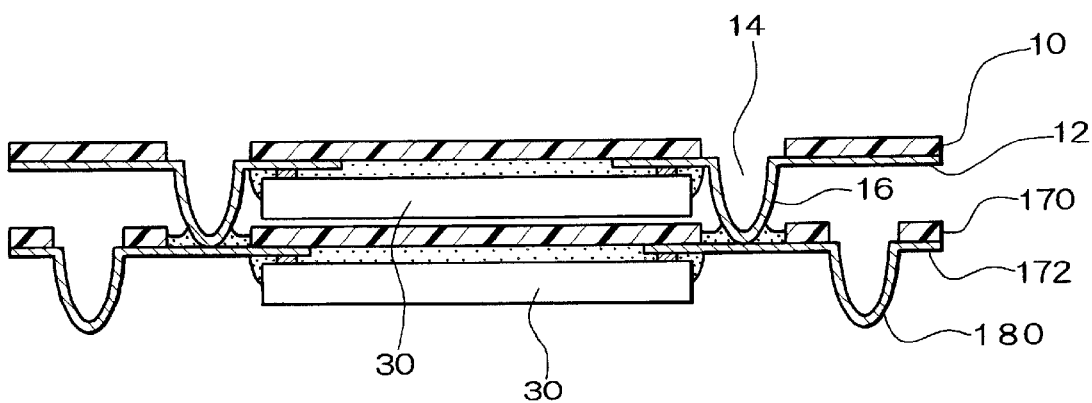
FIG. 10 shows a fourth embodiment of the semiconductor device to which the present invention is applied.

FIG. 10 shows a fourth embodiment of the semiconductor device to which the present invention is applied. This embodiment differs from the first embodiment in the external terminals.

More specifically, in this embodiment, external terminals 180 are provided on a second substrate 170. The external terminals 180 are formed by bending a second interconnect pattern 172. The description of the bent portions 16 described in the first embodiment can be applied to the external terminals 180. In other respects, in FIG. 10, the semiconductor device shown in FIG. 1 is shown upside down.

In other respects, in this embodiment, description of the first embodiment and its modifications can be applied. In this embodiment also, the effect described in the first embodiment can be achieved.

Fifth Embodiment

Figure 11:
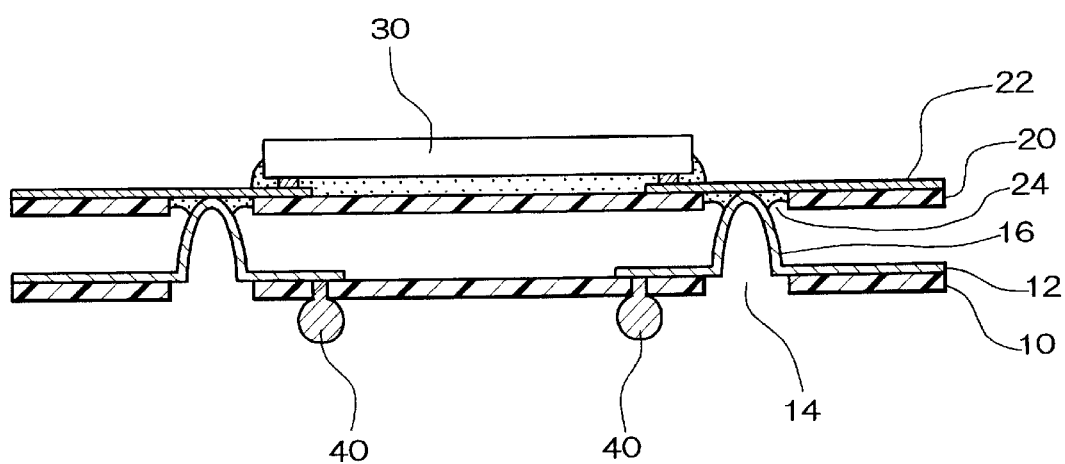
FIG. 11 shows a fifth embodiment of the semiconductor device to which the present invention is applied.

FIG. 11 shows a fifth embodiment of the semiconductor device to which the present invention is applied. This embodiment of the semiconductor device differs from the semiconductor device described in the first embodiment in that a semiconductor chip 30 is mounted one of the first and second substrates 10 and 20 (in FIG. 11, the first substrate 10).

In this case, by means of the first interconnect pattern 12 formed on the first substrate 10 (or as a modification the second interconnect pattern 22 formed on the second substrate 20), the same construction as the multi-layer interconnect is obtained. By means of this, the use of a multi-layer substrate having an expensive jumper construction, or a built-up substrate is no longer required. The content of this embodiment can also be applied to other embodiments. In this embodiment also, the effect described in the first embodiment can be achieved.

Sixth Embodiment

Figure 12:
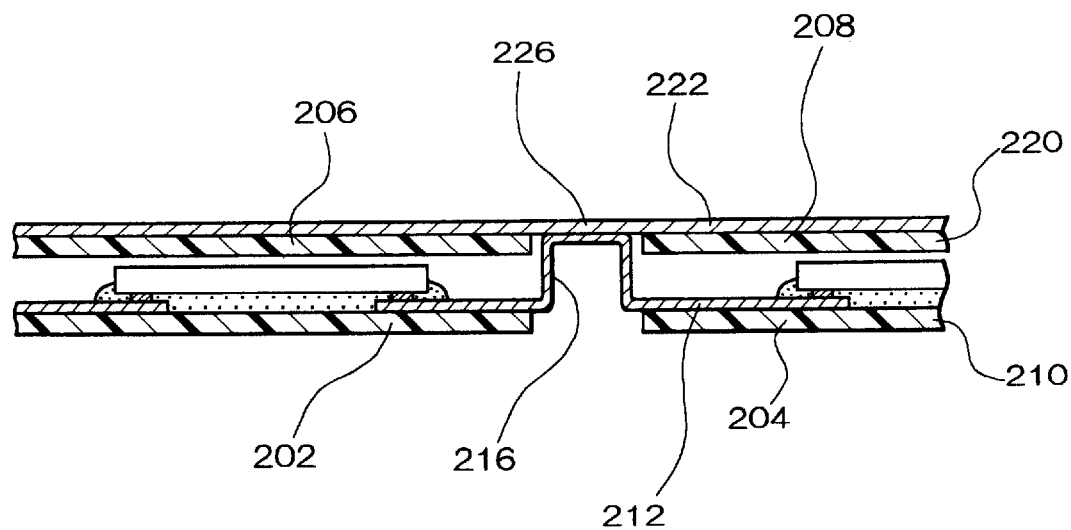
FIG. 12 shows a sixth embodiment of the semiconductor device to which the present invention is applied.

FIG. 12 shows a sixth embodiment of the semiconductor device to which the present invention is applied.

In this embodiment, a first substrate 210 has a plurality of substrates 202 and 204 disposed spaced apart and approximately in the same plane, and a first interconnect pattern 212. A part of the portion of the first interconnect pattern 212 which bridges the gap between the substrates 202 and 204 (interconnect leads) is deformed so that bent portions 216 are formed.

A second substrate 220 has a plurality of substrates 206 and 208 disposed spaced apart and approximately in the same plane, and a second interconnect pattern 222. A part of the second interconnect pattern 222, for example at least a part of the portion bridging the gap between the substrates 206 and 208 (interconnect leads) is a flat portion 226. Then the bent portions 216 and flat portion 226 are bonded. According to this embodiment, the interconnect leads connecting the substrates 202 and 204 or substrates 206 and 208 can be used for electrical connection of the laminated first and second substrates 210 and 220.

In other respects, in this embodiment, the description of the above described embodiments and their modifications can be applied. In this embodiment also, the effect described in the first embodiment can be achieved.

Seventh Embodiment

Figure 13:
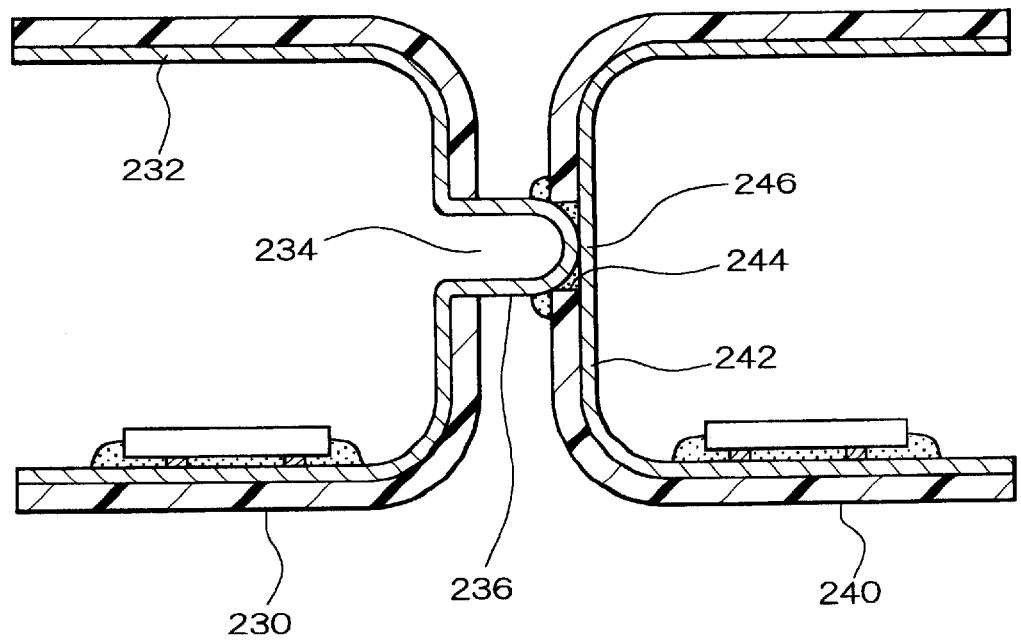
FIG. 13 shows a seventh embodiment of the semiconductor device to which the present invention is applied.

FIG. 13 shows a seventh embodiment of the semiconductor device to which the present invention is applied.

In this embodiment, first and second substrates 230 and 240 formed of a soft material such as polyimide resin are disposed in a bent form. Part of a first interconnect pattern 232 passes through through holes 234 formed in the first substrate 230, and bent portions 236 are formed. The bent portions 236 are bonded to a portion (flat portion 246) exposed through through holes 244 in a second interconnect pattern 242.

In other respects, in this embodiment, the description of the above described embodiments and their modifications can be applied. In this embodiment also, the effect described in the first embodiment can be achieved.

Eighth Embodiment

Figure 14:
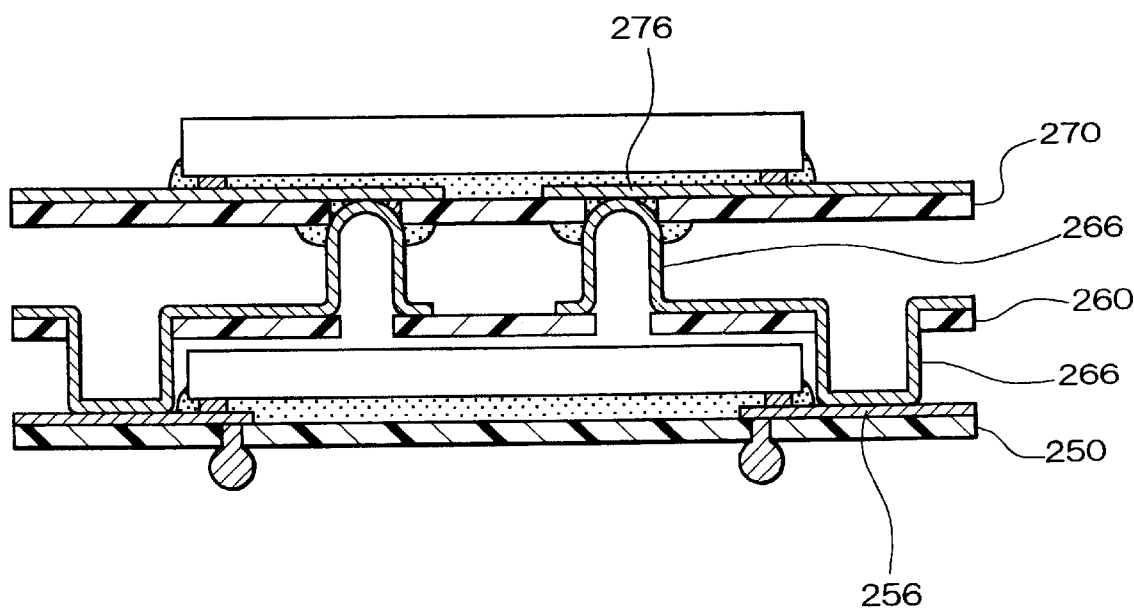
FIG. 14 shows an eighth embodiment of the semiconductor device to which the present invention is applied.

FIG. 14 shows an eighth embodiment of the semiconductor device to which the present invention is applied. This embodiment of the semiconductor device has three substrates 250, 260, and 270, but may have more than three substrates. In the event that there are more than three substrates, the term "three substrates" may refer to any three substrates of the more than three substrates, but may be three consecutively adjacent substrates.

Of the three substrates 250, 260, and 270, the central substrate 260 is a first substrate, and bent portions 266 are formed projecting from each of both sides. The description of the first substrate and bent portions in the above described embodiments and their modifications applies to the substrate 260 and bent portions 266.

Of the three substrates 250, 260, and 270 the outer substrates 250 and 270 are second substrates, and flat portions 256 and 276 are formed. The description of the second substrate and flat portion in the above described embodiments and their modifications applies to the substrates 250 and 270 and flat portions 256 and 276.

In other respects, in this embodiment, the description of the above described embodiments and their modifications can be applied. In this embodiment also, the effect described in the first embodiment can be achieved.

It should be noted that in the method of manufacture of this embodiment of the semiconductor device, all of the bent portions 266 and all of the flat portions 256 and 276 may be simultaneously bonded after overlaying the three or more substrates 250, 260, and 270. By doing this, the process can be made shorter.

Ninth Embodiment

Figure 15:
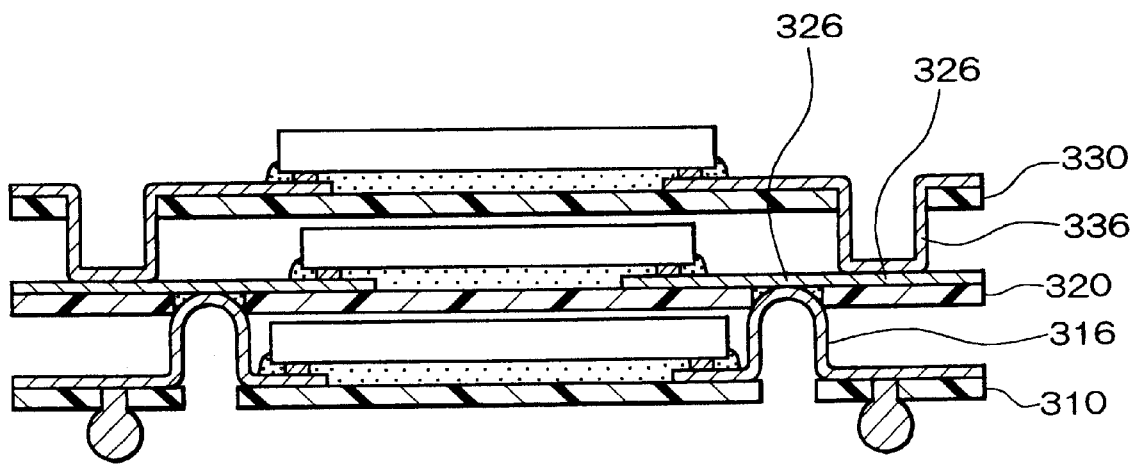
FIG. 15 shows a ninth embodiment of the semiconductor device to which the present invention is applied.

FIG. 15 shows a ninth embodiment of the semiconductor device to which the present invention is applied. This embodiment of the semiconductor device has three substrates 310, 320, and 330, but may have more than three substrates. In the event that there are more than three substrates, the term "three substrates" may refer to any three substrates of the more than three substrates, but may be three consecutively adjacent substrates.

Of the three substrate s 310, 320, and 330, the outer substrates 310 and 330 are first substrates, and bent portions 316 and 336 are formed. The description of the first substrate and bent portions in the above described embodiments and their modifications applies to the substrates 310 and 330 and bent portions 316 and 336.

Of the three substrates 310, 320, and 330, the central substrate 320 is a second substrate, and a plurality of flat portions 326 is formed. To respective flat portions 326, bent portions 316 and 336 are bonded. The description of the second substrate and flat portion in the above described embodiments and their modifications applies to the substrate 320 and flat portions 326.

In other respects, in this embodiment, the description of the above described embodiments and their modifications can be applied. In this embodiment also, the effect described in the first embodiment can be achieved.

It should be noted that in the method of manufacture of this embodiment of the semiconductor device, all of the bent portions 316 and 336 and all of the flat portions 326 may be simultaneously bonded after overlaying all of the three or more substrates 310, 320, and 330.

By means of this, the bent portions 316 and 336 formed on the two or more substrates 310 and 330, and the flat portions 326 can be bonded in a single operation, and the process can be made shorter.

Tenth Embodiment

Figure 16:
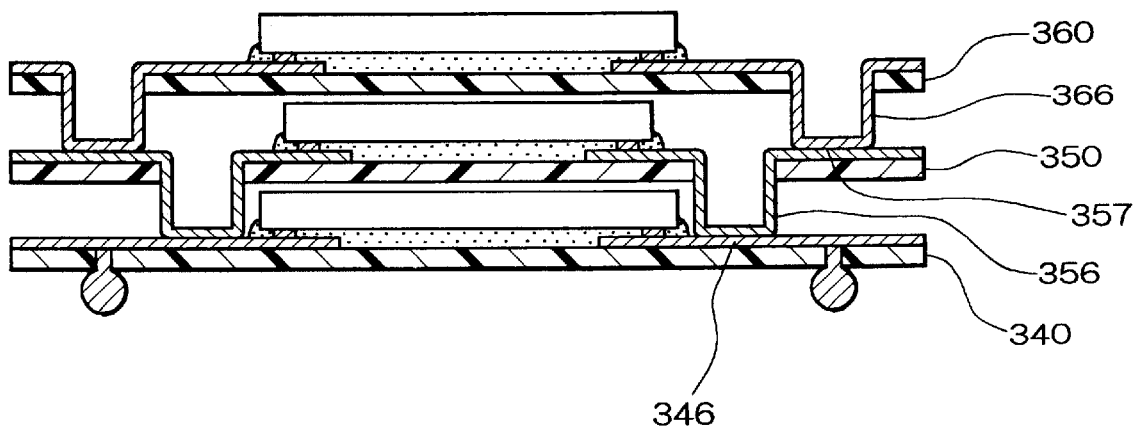
FIG. 16 shows a tenth embodiment of the semiconductor device to which the present invention is applied.

FIG. 16 shows a tenth embodiment of the semiconductor device to which the present invention is applied. This embodiment of the semiconductor device has three substrates 340, 350, and 360, but may have more than three substrates.

One of the two substrates 340 and 360 positioned on the outside (in the example in FIG. 16, the substrate 360) is a first substrate, and bent portions 366 are formed. The other of the two substrates 340 and 360 positioned on the outside (in the example in FIG. 16, the substrate 340) is a second substrate, and a flat portion 346 is formed.

The at least one substrate positioned on the inside (in the example of FIG. 16, the substrate 350) has bent portions 356 and flat portion 357. The substrate 350 is a first substrate with respect to one of the adjacent substrates 340 and 360 (in the example of FIG. 16, the substrate 340). The substrate 350 is a second substrate with respect to the other of the adjacent substrates 340 and 360 (in the example of FIG. 16, the substrate 360). By means of this, the substrate 350 is constructed to function as both a first substrate and a second substrate.

It should be noted that the description of the first and second substrates, the bent portions and the flat portion in the above described embodiments and their modifications applies to the substrates 340, 350, and 360, the bent portions 356 and 366, and the flat portions 346 and 357.

In other respects, in this embodiment, the description of the above described embodiments and their modifications can be applied. In this embodiment also, the effect described in the first embodiment can be achieved.

It should be noted that in the method of manufacture of this embodiment of the semiconductor device, all of the bent portions 356 and 366 and all of the flat portions 346 and 357 may be simultaneously bonded after overlaying all of the three or more substrates 340, 350, and 360.

By means of this, the bent portions 356 and 366 and the flat portions 346 and 357 formed on the two or more substrate 350 and 360 can be bonded in a single operation, and the process can be made shorter.

Other Embodiments

Figure 17:
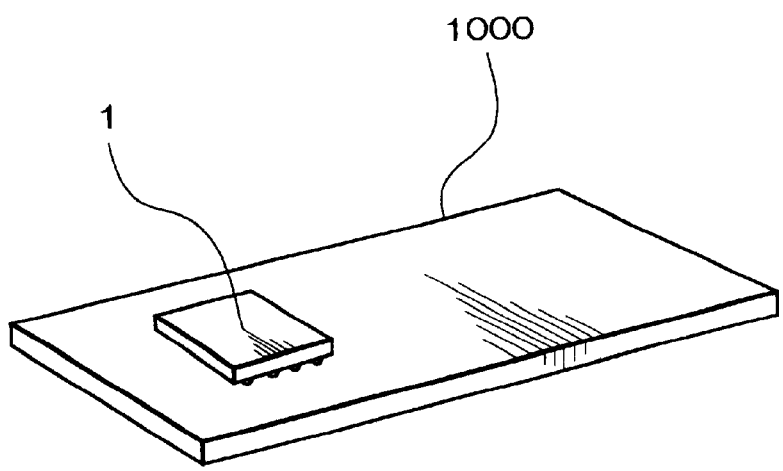
FIG. 17 shows an embodiment of a circuit board to which the present invention is applied.
Figure 18:
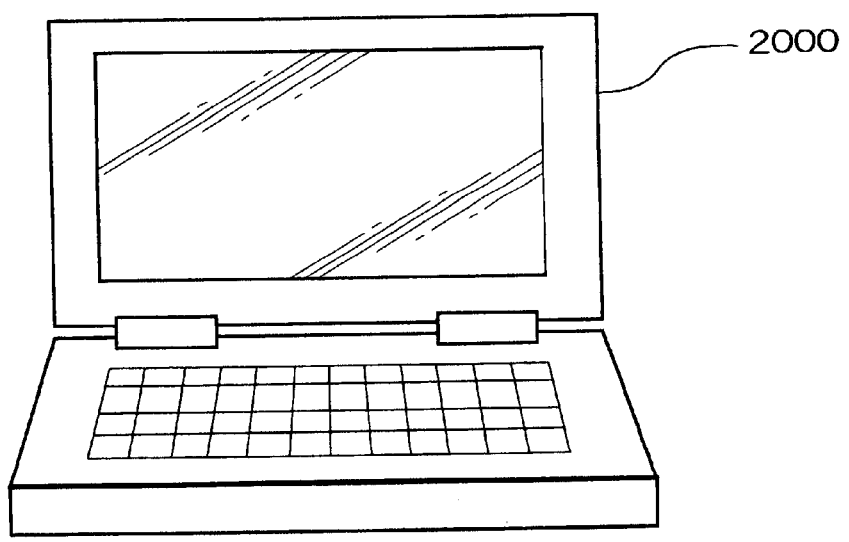
FIG. 18 shows an embodiment of an electronic instrument to which the present invention is applied.
Figure 19:
FIG. 19 shows an embodiment of an electronic instrument to which the present invention is applied.

FIG. 17 shows a circuit board 1000 on which is mounted a semiconductor device 1 manufactured by the method to which the above described embodiments relate. For the circuit board 1000 is generally used an organic substrate such as a glass epoxy substrate or the like. On the circuit board 1000, an interconnect pattern of for example copper is formed to constitute a desired circuit. Then, by mechanical connection of the interconnect pattern and the external terminals of the semiconductor device 1, electrical conduction is achieved. Then as an electronic instrument equipped with the semiconductor device 1 and circuit board 1000, in FIG. 18 is shown a notebook personal computer 2000, and in FIG. 19 is shown a mobile telephone 3000.

It should be noted that in place of the semiconductor chip used in this embodiment, an electronic element (whether an active element or a passive element) can be mounted on a first or second substrate to manufacture an electronic component. As electronic components manufactured using such an electronic element maybe cited, for example, optical elements, resistors, capacitors, coils, oscillators, filters, temperature sensors, thermistors, varistors, variable resistors, and fuses.

Furthermore, in addition to a semiconductor chip, the above described electronic element may be mounted in combination on a first or second substrate, to constitute a mounting module.

What is claimed is:

1. A semiconductor device comprising:
    a plurality of substrates which have interconnect patterns and are disposed so as to be overlaid; and
    a semiconductor chip mounted on at least one of the substrates;
    wherein a first interconnect pattern formed on a first substrate which is one of two substrates included in the plurality of overlaid substrates has at least one bent portion which projects from a surface of the first substrate; and
    wherein the bent portion is electrically connected to at least one flat portion of a second interconnect pattern formed on a second substrate of the two substrates.

2. The semiconductor device as defined in claim 1,
    wherein a through hole is formed in the first substrate; and
    wherein the bent portion enters the through hole, and projects from a surface of the first substrate opposite to the surface on which the first interconnect pattern is formed.

3. The semiconductor device as defined in claim 1,
    wherein a through hole is formed in the first substrate; and
    wherein the bent portion is positioned over the through hole and projects from the surface of the first substrate on which the first interconnect pattern is formed.

4. The semiconductor device as defined in claim 2,
    wherein a plurality of the bent portions are formed within the through hole.

5. The semiconductor device as defined in claim 3,
    wherein a plurality of the bent portions are formed over the through hole.

6. The semiconductor device as defined in claim 2,
    wherein a plurality of the through holes are formed in the first substrate;
    wherein a plurality of the bent portions are formed in the first interconnect pattern; and
    wherein each of the bent portions is formed so as to be positioned over one of the through holes.

7. The semiconductor device as defined in claim 3,
    wherein a plurality of the through holes are formed in the first substrate;
    wherein a plurality of the bent portions are formed in the first interconnect pattern; and
    wherein each of the bent portions is formed so as to be positioned over one of the through holes.

8. The semiconductor device as defined in claim 1, wherein the second interconnect pattern is formed on a surface of the second substrate on the side of the first substrate.

9. The semiconductor device as defined in claim 1, wherein the second interconnect pattern is formed on a surface of the second substrate opposite to the surface of the second substrate which faces to the first substrate; and wherein the bent position is electrically connected to the second interconnect pattern through the through hole formed in the second substrate.

10. The semiconductor device as defined in claim 1, wherein the semiconductor chip is provided between the first and second substrates; and wherein the bent portion projects to the side of the semiconductor chip, and is formed to be higher than the semiconductor chip.

11. The semiconductor device as defined in claim 1, wherein the semiconductor chip is provided on each of the first and second substrates.

12. The semiconductor device as defined in claim 1, wherein the semiconductor chip is provided on one of the first and second substrates.

13. The semiconductor device as defined in claim 1, wherein the number of the substrates provided to be overlaid is three or more; wherein a central substrate of the three substrates is the first substrate, and the bent portions project from both surfaces of the first substrate; and wherein outer substrates of the three substrates are the second substrate.

14. The semiconductor device as defined in claim 1, wherein the number of the substrates provided to be overlaid is three or more; and wherein a central substrate of the three substrates is the second substrate, and outer substrates are the first substrate.

15. The semiconductor device as defined in claim 1, wherein the number of the substrates provided to be overlaid is three or more; wherein one of two outer substrates of the overlaid substrates is the first substrate, and the other is the second substrate; and wherein at least one center substrate of the overlaid substrates has the bent portion and the flat portion, and is the first substrate with respect to one of the two outer substrates, and is the second substrate with respect to the other of the two outer substrates.

16. A circuit board on which is mounted the semiconductor device as defined in claim 1.

17. An electronic instrument having the semiconductor device as defined in claim 1.

18. A method of manufacture of a semiconductor device, comprising the steps of:

mounting a semiconductor chip on at least one of a plurality of substrates having interconnect patterns;

providing the substrates so as to be overlaid; and electrically connecting two substrates of the overlaid substrates;

wherein a first interconnect pattern formed on a first substrate of the two substrates has a bent portion which projects from a surface of the first substrate; and wherein the bent portion is electrically connected to a flat portion of a second interconnect pattern formed on a second substrate of the two substrates.

19. The method of manufacture of a semiconductor device as defined in claim 18, wherein the plurality of substrates are positioned with the outer form of the substrates as a reference.

20. The method of manufacture of a semiconductor device as defined in claim 18, wherein the plurality of substrates are positioned with holes formed in the substrates as a reference.

21. The method of manufacture of a semiconductor device as defined in claim 18, wherein at least one of pressure and heat is applied to the bent portion to electrically connect the bent portion to the flat portion.

22. The method of manufacture of a semiconductor device as defined in claim 21, wherein the bent portion is formed on each of the interconnect patterns formed on the substrates; and wherein the bent portion formed on each of the substrates is electrically connected to the flat portion in a single operation.

* * * * *